United States Patent
Vashchenko et al.

(10) Patent No.: US 6,355,959 B1
(45) Date of Patent: Mar. 12, 2002

(54) GATE ELECTRODE CONTROLLABLE ELECTROSTATIC DISCHARGE (ESD) PROTECTION STRUCTURE HAVING A MOSFET WITH SOURCE AND DRAIN REGIONS IN SEPARATE WELLS

(75) Inventors: Vladislav Vashchenko, Fremont; Peter J. Hopper; Manuel Carneiro, both of San Jose, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/658,743

(22) Filed: Sep. 11, 2000

(51) Int. Cl.[7] .............................................. H01L 27/01
(52) U.S. Cl. ...................................... 257/355; 257/360
(58) Field of Search ................................... 257/355, 360

(56) References Cited

U.S. PATENT DOCUMENTS 6,265,251 B1 * 7/2001 Jan et al. ..................... 257/347

* cited by examiner

Primary Examiner—Fetsum Abraham
(74) Attorney, Agent, or Firm—Pillsbury Winthrop LLP

(57) ABSTRACT

An ESD protection structure for use with ICs that can protect from ESD events of both positive and negative polarities, has a low snapback holding voltage and a high maximum snapback current, and is relatively immune to thermal overheating. The structure includes a semiconductor substrate of a first conductivity type (typically P-type), as well as first and second well regions of a second conductivity type (typically N-type) that are separated a gap region of the first conductivity type and disposed in the substrate. A gate silicon dioxide layer overlies the gap region and a gate electrode overlies the gate silicon dioxide layer. Also included are first and second floating regions (of the second conductivity type) disposed in the first and second well regions adjacent to the gap region, respectively. The structure further includes first and second contact regions of the first conductivity type disposed on the first and second well regions, respectively, and spaced apart from the first and second floating regions, respectively. Also included are first and second contact regions of the second conductivity type disposed on the first and second well regions, respectively, and spaced apart from the first and second floating regions, respectively. During operation, the structure undergoes low current avalanche breakdown of the gap region between the first and second floating regions, followed by "double injection" of both holes and electrons. The structure's symmetrical nature provides for protection from both positive and negative ESD events and the gate electrode provides breakdown control capability.

10 Claims, 1 Drawing Sheet

GATE ELECTRODE CONTROLLABLE ELECTROSTATIC DISCHARGE (ESD) PROTECTION STRUCTURE HAVING A MOSFET WITH SOURCE AND DRAIN REGIONS IN SEPARATE WELLS

BACKGROUND OF THE INVENTION

1. Field of the Invention

The present invention relates to semiconductor device structures and, in particular, to electrostatic discharge protection structures for use with integrated circuits.

2. Description of the Related Art

Electrostatic Discharge (ESD) protection devices are commonly employed in an integrated circuit (IC) to protect electronic devices in the IC from spurious pulses of excessive voltage (e.g., an ESD event, Human Body Model [HBM] event, or Electrical Overstress [EOS] event). See, for example, S. M. Sze, *Electrostatic Discharge Damage*, in VLSI Technology, Second Edition, 648–650 (McGraw Hill, 1988). A variety of conventional ESD protection devices that make extensive use of diodes, metal-oxide-semiconductor field effect transistors (MOSFETs), and bipolar transistors are known in the field. For example, conventional ESD protection devices for use with CMOS integrated circuits include Grounded Gate MOS (GGMOS) ESD protection structures and Low Voltage Triggered Silicon Controlled Rectifier (LVTSCR) ESD protection structures. Descriptions of these and other conventional ESD protection structures are available in Haigang, et al., A Comparison Study of ESD Protection for RFICs: Performance vs. Parasitics, 2000 IEEE Radio Frequency Integrated Circuits Symposium, 235–237 (2000); U.S. patent application for "MOSFET Structure For Use in ESD Protection Devices" (filed Jul. 17, 2000; application number not yet assigned) and U.S. patent application No. 09/205,110 (filed Dec. 3, 1998), each of which is hereby fully incorporated by reference.

Conventional MOSFET structures are designed to exhibit breakdown characteristics only at voltages well above their standard operating supply voltage. However, during an ESD event, GGMOS ESD structures exhibit current conduction via a parasitic lateral bipolar mechanism. For a further description of current conduction in GGMOS ESD structures via a parasitic lateral bipolar mechanism, see E. A. Amerasekera et al., ESD in Silicon Integrated Circuits, sections 3.5.2 and 3.6 (John Wiley & Sons, 1995), which are hereby fully incorporated by reference.

ESD events can be of either a negative polarity or a positive polarity. Conventional GGMOS and LVTSCR ESD protection structures can only protect electronic devices in an IC from a single polarity ESD event. Thus, two such structures are required to protect electronic devices in an IC from ESD events of both polarities.

The ESD protection capability of ESD protection devices is characterized by their snapback holding voltage and their maximum snapback current. ESD protection capability is improved at lower snapback holding voltages and higher maximum snapback current. Conventional GGMOS and LVTSCR ESD protection structures operate via an avalanche-injection conductivity modulation mechanism. This mechanism, however, provides a relatively high snapback holding voltage and a relatively low snapback current. In addition, conventional ESD protection structures are subject to thermal overheating and associated irreversible damage and/or instability during an ESD event.

Still needed in the field, therefore, is an ESD protection structure that can protect electronic devices in an IC from ESD events of both positive and negative polarities, has a low snapback holding voltage and a high maximum snapback current, and is relatively immune to thermal overheating.

SUMMARY OF THE INVENTION

The present invention provides an ESD protection structure for use with ICs that can protect electronic devices in an IC from ESD events of both positive and negative polarities, has a low snapback holding voltage and a high maximum snapback current, and is relatively immune to thermal overheating.

ESD protection structures for use with ICs according to the present invention include a semiconductor substrate (e.g., a silicon substrate) of a first conductivity type (typically P-type), a first well region of a second conductivity type (typically N-type) disposed in the semiconductor substrate, and a second well region, also of the second conductivity type, disposed in the semiconductor substrate. The first and second well regions are separated by a gap region of the first conductivity type that is disposed in the semiconductor substrate.

Also included in ESD protection structure according to the present invention are a gate silicon dioxide layer overlying the gap region and a gate electrode (e.g., a polysilicon gate electrode) overlying the gate silicon dioxide layer. The ESD protection structures further include a first floating region and a second floating region, each of the second conductivity type, disposed in the first well region and second well region, respectively. The first and second floating regions are adjacent to the gap region. In addition, the ESD protection structures include first and second contact regions of the first conductivity type disposed on the first and second well regions, respectively, and spaced apart from the first and second floating regions, respectively. The ESD protection structures further include first and second contact regions of the second conductivity type that are also disposed on the first and second well regions, respectively, and also spaced apart from the first and second floating regions, respectively.

ESD protection structures according to the present invention can be thought of as a variant of an MOS-TRIAC structure that provides for ESD protection capability by the distinctive addition of first and second floating regions, a P-type contact region and an N-type contact region in each of the first and second well regions and a gate electrode.

During operation, ESD protection structures according to the present invention undergo primary breakdown via a low current avalanche breakdown mechanism in the gap region between the first and second floating regions. Following this low current avalanche breakdown, and when the current has exceeded a critical switching value, the ESD protection structures exhibit "double injection" of holes and electrons from an N-type and a P-type contact region, one in each of the first and second well regions, to attain a high maximum snapback current. This high maximum snapback current is attributed to mutual space charge neutralization and conductivity modulation in the gap region (and an associated reduction in the electric field). The primary breakdown and critical switching value of the ESD protection structure can be controlled by an applied or induced potential on the gate electrode.

An advantage of ESD protection structures according to the present invention is that they are symmetrical (i.e., each of the first and second well regions has both an N-type contact region and a P-type contact region disposed therein).

The ESD protection structures can, therefore, protect electronic devices in an IC from ESD events of both a negative and a positive polarity. ESD protection structures for use with ICs according to the present invention can be manufactured using conventional semiconductor manufacturing techniques (e.g., 0.18 micron CMOS process technologies) and are, therefore, compatible for use with CMOS integrated circuits.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

To be consistent throughout the present specification and for clear understanding of the present invention, the following definitions are provided for terms used therein:

The terms "dopant" and "dopants" refer to donor and acceptor impurity atoms (e.g., boron [B], phosphorous [P], arsenic [As] and indium [In]), which are intentionally introduced into a semiconductor substrate (e.g., a silicon wafer) in order to change the substrate's charge-carrier concentration. See, R. S. Muller and T. I. Kamins, Device Electronics for Integrated Circuits 2nd Edition, 11–14 (John Wiley and Sons, 1986) for a further description of dopants.

Figure 1:
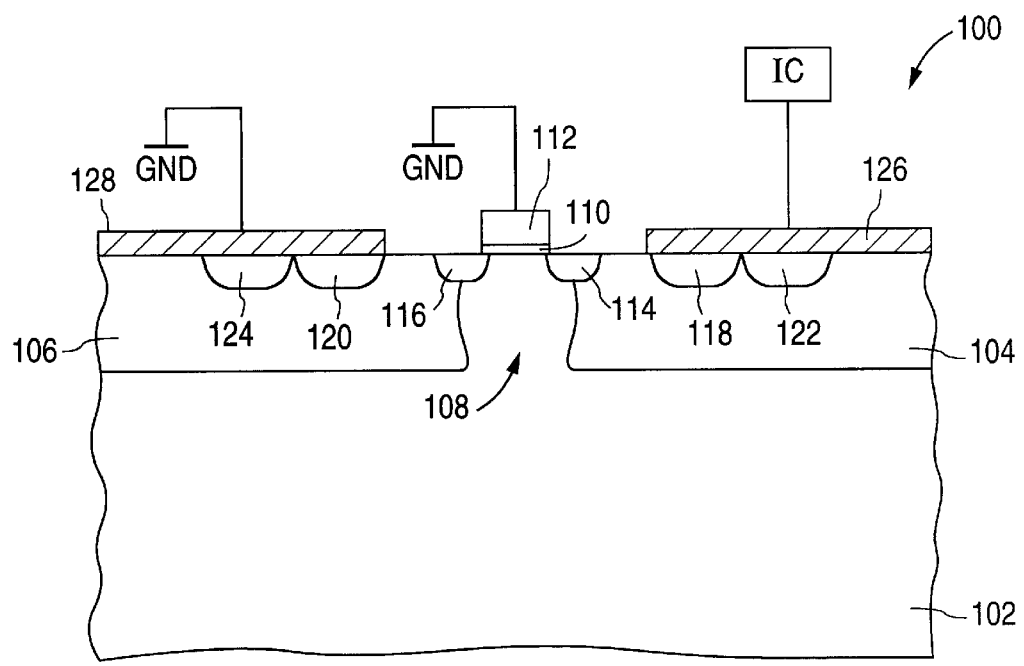
FIG. 1 is a combined cross-sectional and electrical schematic depiction of an ESD protection structure in accordance with the present invention.

FIG. 1 illustrates an ESD protection structure 100 for use with ICs according to the present invention. ESD protection structure 100 includes a P-type semiconductor substrate 102 (e.g., a P-type silicon substrate, a P-type epitaxial silicon substrate or a high resistance P-type silicon substrate). The dopant concentration in the semiconductor substrate 102 can be any conventional level known in the art. ESD protection structure 100 also includes a first N-type well region 104 and a second N-type well region 106 disposed in the semiconductor substrate 102. The dopant concentrations of the first and second N-type well regions are essentially identical. The dopant concentrations and dimensions of the first and second N-type well regions depend on the semiconductor manufacturing process technology employed to create the ESD protection structure. However, a typical dopant concentration for ESD protection structures created with an 0.18 micron CMOS technology is in the range of 1E17 atoms/ cm² to 1E20 atoms/ cm², while a typical depth of the first and second N-type well regions is 1.25 microns.

The first N-type well region and second N-type well region are separated by a P-type gap region 108 disposed in the semiconductor substrate 102. For a 0.18 micron CMOS process technology, the P-type gap region 108 separates the first N-type well region 104 from the second N-type well region 106 by a minimum distance in the range of 0.18 microns to 0.25 microns. The P-type gap region 108 functions as a discharge space during an ESD event.

Overlying the P-type gap region 108 is a gate silicon dioxide ($SiO_2$) layer 110, which is overlaid by a gate electrode 112 (e.g., a polysilicon gate electrode). Although the gate electrode 112 is depicted in the embodiment of FIG. 1 as connected to ground (GND), it can be floating or connected to the IC.

The presence of a gate silicon dioxide layer and a gate electrode provides breakdown control capability to the ESD protection structure since, during an ESD event, the presence of an induced or applied potential on the gate electrode can result in an early breakdown and switching of the ESD protection structure by altering the electrical characteristics of the gap region. In addition, the presence of a gate electrode directly above the P-type gap region provides a means for the first and second floating regions to be accurately self-aligned adjacent to the P-type gap region via conventional implantation techniques.

Also included in ESD protection structure 100 are a first N-type floating region 114 disposed in the first N-type well region 104 adjacent to the P-type gap region 108, as well as a second N-type floating region 116 disposed in the second N-type well region 106 adjacent to the P-type gap region 108. The dopant concentrations of the first and second N-type floating regions 114, 116 are greater than that of the first and second N-type well regions 104, 106. The first and second N-type floating regions 114, 116, therefore, provide a sharp P/N junction between themselves and the P-type gap region 108. This sharp P/N junction provides an ESD protection structure 100 with a low trigger voltage (e.g., a trigger voltage in the range of 6 volts to 8 volts). In the absence of the first and second N-type floating regions 114, 116, the trigger voltage would be unacceptably high (e.g., in the range of 15 volts to 25 volts) due to the presence of only the relatively smooth P/N junctions that are formed between the N-type well regions and the P-type gap region during conventional CMOS technology processing.

ESD protection structure 100 also includes four contact regions: (i) a first P-type contact region 118 disposed on the first N-type well region 104 that is spaced apart from the first N-type floating region 114; (ii) second P-type contact region 120 disposed on the second N-type well region 106 and spaced apart from the second N-type floating region 116; (iii) a first N-type contact region 122 disposed on the first N-type well region 104 and spaced apart from the first N-type floating region 114; and (iv) a second N-type contact region 124 disposed on the second N-type well region 106 and spaced apart from the second N-type floating region 116.

The ESD protection structure 100 of FIG. 1 further includes a first electrical contact 126 connected to the first P-type contact region 118, the first N-type contact region 122 and an IC. For example, first electrical contact 126 can be connected to a line, pin or bus of an IC, for which ESD protection is desired. In addition, ESD protection structure 100 includes a second electrical contact 128 connected to the second P-type contact region 120, the second N-type contact region 124 and ground (GND). First and second electrical contacts 126, 128 can be formed using conventional semiconductor processing techniques including metal silicidation or metal deposition.

During an ESD event, an ESD pulse arriving at the first electrical contact 126 will provide a low level of current flow across the P-type gap region 108. This low level of current flow initiates primary breakdown of the ESD protection structure 100 via low current avalanche breakdown of the P-type gap region 108 between the first N-type floating region 114 and the second N-type floating region 116. This avalanche breakdown occurs at a trigger voltage that is dependent on the dopant profiles of the first and second N-type floating regions 114, 116 and the P-type gap region 108, as well as the separation distance between the first and second N-type well regions 104, 106 and any applied or induced potential on gate electrode 112.

The structural arrangement of the N-type first and second floating regions 114, 116 and the P-type gap region 108 creates an NPN sub-structure in the center of the ESD protection structure 100. Since the distance separating the first and second N-type floating regions 114, 116 (i.e., the width of the P-type gap region 108) is relatively short, the space charge region available in the P-type gap region 108 is limited by the presence of the first and second N-type well regions 104, 106. The breakdown voltage of the P-type gap region 108 is, therefore, to some extent proportional to the separation between the first and second N-type well regions 104, 106 (i.e., to the width of the P-type gap region 108) and, as noted above, any applied or induced potential on the gate electrode 112. Therefore, the trigger voltage of the ESD protection structure can be tuned to suit particular needs by providing a gap region of the appropriate width.

As the ESD event continues, the current increases to a critical switching level whereupon the ESD protection structure enters a switching state. In the switching state, "double injection" occurs from a single contact region in both of the N-type well regions. By providing both a P-type contact region and an N-type contact region in each N-type well (i.e., by providing "double junctions"), ESD protection structures according to the present invention are capable of operating via a "double injection" mechanism. This "double injection" mechanism involves the injection of both holes and electrons, one from each side of the ESD protection structure, regardless of the polarity of an ESD pulse. In other words, depending on the polarity of ESD event, either holes are injected from the first P-type contact region or electrons are injected from the first N-type contact region. At the same time, however, either electrons are injected from the second N-type contact region or holes are injected from the second P-type contact region. This double injection (i.e., the injection of holes occurring from a contact region in one of the well regions, while the injection of electrons occurs from a contact region in the other well region) results in mutual space charge neutralization (i.e., the positive and negative currents of the holes and electrons compensate one another). This mutual space charge neutralization results in a conductivity modulation in the gap region (and an associated reduction in the electric field) that supports the attainment of relatively high maximum snapback currents.

ESD protection structures for use with ICs according to the present invention can, if desired, be formed with the first and second N-type well regions in an elongated "finger" arrangement (with a finger length of, for example 50 microns to 100 microns) or as multiple connected fingers.

Figure 2:
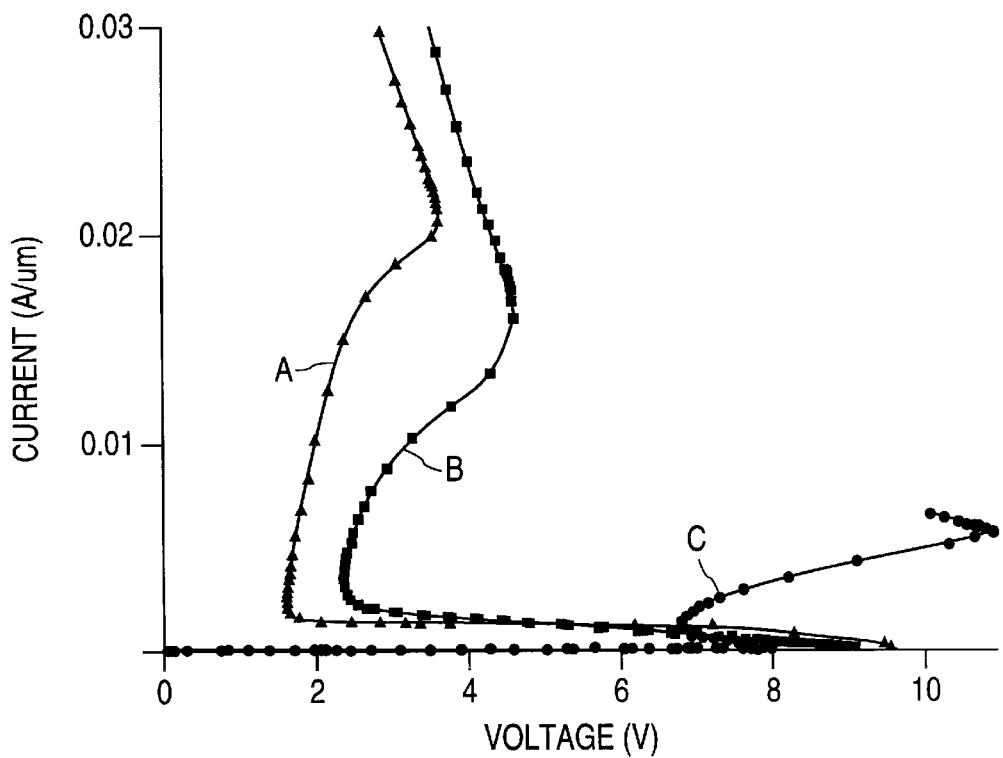
FIG. 2 is a current versus voltage (I–V) graph illustrating the simulated electrical behavior of an ESD protection structure according to the present invention formed using a 0.18 micron CMOS process technology (curve A), a conventional LVTSCR ESD protection structure formed using the same 0.18 micron CMOS process technology (curve B), and a conventional GGMOS ESD protection structure formed using the same 0.18 micron CMOS process technology (curve C).

FIG. 2 illustrates the I–V characteristics obtained from a numerical simulation for an ESD protection structure according to the present invention formed using a 0.18 micron CMOS process technology (curve A), a conventional LVTSCR ESD protection structure formed using the same 0.18 micron CMOS process technology (curve B) and a conventional GGMOS ESD protection structure formed using the same 0.18 micron CMOS process technology (curve C). Analysis of the numerical simulation results indicates that the ESD protection structure according to the present invention has a lower snapback holding voltage and a higher maximum snapback current than the conventional GGMOS and LTSCR ESD protection structures. In addition, FIG. 2 indicates that ESD protection structures according to the present invention have an operating regime that is improved by 10 fold in comparison with the conventional GGMOS ESD protection structure, while the improvement is 30% in comparison with the conventional LVTSCR ESD protection structure. These improvements can be interpreted as increasing the ESD protection capability in roughly the same proportion. This 10-fold increase in ESD protection capability allows the use of ESD structures of 10 times less area to obtain the same level of ESD protection (e.g., protection against a 2–4 KeV pulse) as a conventional GGMOS ESD protection structure or the provision of increased ESD protection for an ESD protection structure of the same area.

Analysis of ESD protection structures according to the present invention during high current operation indicates that the maximum temperature attained during such operation is localized in the vicinity of the bottom of the second N-type well region 106 adjacent to the P-type gap region 108. In a conventional GGMOS ESD protection structure, the maximum temperature is localized in the immediate vicinity of the structure's gate electrode. Since the maximum temperature in ESD protection structures according to the present invention is localized in the vicinity of the bottom of the second N-type well region, rather than in the immediate vicinity of the gate electrode 112, such ESD protection structures are expected to be relatively immune to thermal overheating.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. An ESD protection structure for use with an integrated circuit comprising:

a semiconductor substrate of a first conductivity type;

a first well region of a second conductivity type disposed in the semiconductor substrate;

a second well region of the second conductivity type disposed in the semiconductor substrate;

a gap region of the first conductivity type disposed in the semiconductor substrate and separating the first well region from the second well region;

a gate silicon dioxide layer overlying the gap region;

a gate electrode overlying the gate silicon dioxide layer;

a first floating region of the second conductivity type disposed in the first well region adjacent to the gap region;

a second floating region of the second conductivity type disposed in the second well region adjacent to the gap region;

a first contact region of the first conductivity type disposed on the first well region and spaced apart from the first floating region;

a second contact region of the first conductivity type disposed on the second well region and spaced apart from the second floating region;

a first contact region of the second conductivity type disposed on the first well region and spaced apart from the first floating region; and a second contact region of the second conductivity type disposed on the second well region and spaced apart from the second floating region.

2. The ESD protection structure of claim 1 further comprising:
a first electrical contact connected to the first contact region of the first conductivity type, the first contact region of the second conductivity type, and the integrated circuit; and
a second electrical contact connected to the second contact region of the first conductivity type, the second contact region of the second conductivity type and ground.

3. The ESD protection structure of claim 1, wherein the first conductivity type is P-type and the second conductivity type is N-type.

4. The ESD protection structure of claim 1, wherein the dopant concentrations of the first floating region and the second floating region are greater than the dopant concentrations of the first well region and the second well region.

5. The ESD protection structure of claim 4, wherein the dopant concentration of the first well region and the second well region is at least 1E17 atoms per $cm^2$.

6. The ESD protection structure of claim 1, wherein the gap region separates the first well region from the second well region with a minimum distance in the range of 0.18 microns to 0.25 microns.

7. The ESD protection structure of claim 1, wherein the first well region and the second well region are disposed in the semiconductor substrate in an elongated finger configuration.

8. The ESD protection structure of claim 1, wherein the gate electrode is floating.

9. The ESD protection structure of claim 1, wherein the gate electrode is connected to ground.

10. The ESD protection structure of claim 1, wherein the gate electrode is connected to the integrated circuit.

* * * * *

UNITED STATES PATENT AND TRADEMARK OFFICE
CERTIFICATE OF CORRECTION

PATENT NO.    : 6,355,959 B1
DATED         : March 12, 2002
INVENTOR(s)   : Vladislav Vashchenko et al.

It is certified that error appears in the above-identified patent and that said Letters Patent is hereby corrected as shown below:

<u>Title page,</u>
Item [54] after "SOURCE" delete "AND".

Signed and Sealed this

Twenty-first Day of May, 2002

Attest:

*Attesting Officer*

JAMES E. ROGAN
*Director of the United States Patent and Trademark Office*